United States Patent [19]

Tanaka et al.

[11] Patent Number: 5,132,640
[45] Date of Patent: Jul. 21, 1992

[54] DIFFERENTIAL CURRENT AMPLIFIER CIRCUIT

[75] Inventors: Tatsuo Tanaka, Fujisawa; Makoto Kubo, Yokohama, both of Japan

[73] Assignee: Kabushiki Kaisha Toshiba, Kanagawa, Japan

[21] Appl. No.: 689,943

[22] PCT Filed: Oct. 4, 1990

[86] PCT No.: PCT/JP90/01286

§ 371 Date: Jun. 4, 1991

§ 102(e) Date: Jun. 4, 1991

[30] Foreign Application Priority Data

Oct. 6, 1989 [JP] Japan .................... 1-260293

[51] Int. Cl.⁵ .................................... H03F 3/45
[52] U.S. Cl. ........................... 330/252; 330/257; 330/261
[58] Field of Search .............. 330/252, 261, 257

[56] References Cited

U.S. PATENT DOCUMENTS

| | | | |
|---|---|---|---|
| 4,238,738 | 12/1980 | Komori | 330/257 |
| 4,451,800 | 5/1984 | Nishioka et al. | 330/257 |
| 4,558,287 | 12/1985 | Tanaka | 330/252 |
| 4,590,435 | 5/1986 | Tanaka | 330/257 |
| 4,620,161 | 10/1986 | Tanaka et al. | 330/257 |

FOREIGN PATENT DOCUMENTS 61-146005 7/1986 Japan .................... 330/252

Primary Examiner—Eugene R. LaRoche
Assistant Examiner—Tan Dinh
Attorney, Agent, or Firm—Finnegan, Henderson, Farabow, Garrett and Dunner

[57] ABSTRACT

A differential current amplifier circuit having first and second transistors (Q1, Q2) whose collectors are supplied with first and second input signals (INA, INB), respectively, and first and second resistors (R1, R2) connected between the base and the collector of each of the transistors. When the resistors have the same resistance and the signals (INA, INB) are inputted to the input terminals, the potential of the common base node of the first and second transistors goes to a substantially ground potential, and the signal current component (i) does not flow through the first and second transistors. Thus, only DC currents (2I, 2nI) which are not superposed by the signal current component (i) flow through third and fourth transistors connected in a current mirror fashion, and an additional DC current source is not needed at this portion. Furthermore, the fourth transistor (Q4) is used as a constant current source of a differential pair constituted by fifth and sixth transistors (Q5, Q6), and an amplified signal component ($2i_2$) is obtained from the output terminal (OUT) of the differential pair. Thus, a large current gain is obtained.

2 Claims, 3 Drawing Sheets 5,132,640

DIFFERENTIAL CURRENT AMPLIFIER CIRCUIT

TECHNICAL FIELD

The present invention relates to a differential current amplifier circuit formed in a semiconductor integrated circuit.

BACKGROUND ART

A conventional differential current amplifier circuit, which is designed to amplify a differential input current, has the structure illustrated in FIG. 1. More specifically, the circuit comprises a first signal input terminal IN1 and NPN transistors Q1 and Q2. The terminal IN1 is connected to receive an input signal current $(I+i)$ consisting of a DC component I and a signal component $(+i)$ superposed on the DC component. The collector-base path of the NPN transistor Q1 is connected to the first signal input terminal IN1 and the emitter of the NPN transistor Q1 is connected to the ground potential GND. The NPN transistor Q2 has an emitter area n times greater than that of the transistor Q1 and is connected to transistor Q2 in currentmirror fashion. The collector of the NPN transistor Q2 is connected to a first terminal OUT1. The transistors Q1 and Q2 form a first current mirror circuit. A second signal input terminal IN2 is connected to receive an input signal current $(I-i)$ consisting of a DC component I and a signal component $(-i)$ which is differential to the signal component $(+i)$ and superposed on the DC component I. The amplifier circuit further comprises NPN transistors Q3 and Q4. The collector-base path of the NPN transistor Q3 is connected to the second signal input terminal IN2, and the emitter of the NPN transistor Q3 is connected to the ground potential GND. The transistor Q4 has an emitter area n times greater than that of the transistor Q3, and is connected to the transistor Q3 in current-mirror fashion. The collector of the transistor Q4 is connected to a second output terminal OUT2. The transistors Q3 and Q4 form a second current mirror circuit.

In the differential current amplifier circuit of FIG. 1, the collector current of the transistor Q2 (i.e., the current output from the first output terminal OUT1 is $n(I+i)$, whereas the collector current of the transistor Q4 (i.e., the current output from the second output terminal OUT2) is $n(I-i)$.

Therefore, the current gain Gi is:

$$Gi = n \qquad (1)$$

The current gain Gi is no more than the current-mirror ratio n, i.e., the ratio of the emitter area of the transistor Q2 to that of the transistor Q1 or the ratio of the emitter area of the transistor Q4 to that of the transistor Q3.

FIG. 2 shows a modification of the differential current amplifier circuit of FIG. 1. This amplifier circuit is different from the circuit of FIG. 1 in that it has an input-signal current source and transistors Q5 and Q6. The current source supplies a differential input-signal current consisting of a DC component I and a signal component (either $+i$ or $-i$) superposed on the DC component I. Since the circuit is identical to the circuit of FIG. 1 in all other respects, the same symbols and numerals are used to designate the same components as those illustrated in FIG. 1. The input-signal current source comprises PNP transistors Q01 and Q02 and a constant current source 60. The NPN transistors Q01 and Q02 have their emitters connected together and, thus, constitute a differential pair. The constant current source 60 is connected between the emitter node of the transistors Q01 and Q02 and a Vcc-current potential, and supplies a constant current 2I. The collectors of the transistors Q01 and Q02 are connected to the collectors of the transistors Q1 and Q3, respectively. Hence, when input voltages INA and INB, either containing a differential signal component, are applied to the bases of the transistors Q01 and Q02, signal currents $(I+i)$ and $(I-i)$ flow to the transistors Q1 and Q3, respectively. The PNP transistors Q5 and Q6 are connected together in mirror-current fashion. Their emitters are coupled to the Vcc potential, their bases are connected to each other, and their collectors are connected to the collectors of the transistors Q2 and Q4. The base and collector of the transistor Q6 are connected together. The collector of the transistor Q5 is coupled to an output terminal OUT. A load resistor RL is connected between the output terminal OUT and the ground GND.

In the differential current amplifier circuit of FIG. 2, the output current $(I-i)$ of the transistor Q4 is subtracted from the output current $(I+i)$ of the transistor Q2 by means of the third current mirror circuit, thereby extracting a signal component. Hence, the current $i_{out}$ by the amplifier circuit is 2ni. In other words, the current gain Gi of the circuit is:

$$Gi = 2n \qquad (2)$$

Obviously, this current gain is twice the current gain Gi of the differential current amplifier circuit illustrated in FIG. 1.

In the differential current amplifier circuit of FIG. 2, however, it is necessary to used more and more current-mirror stages in order to increase the current gain Gi. The circuit needs to have more elements, and inevitably consume more power. If the current-mirror ratio (i.e., the emitter-area ratio) is increased, each transistor must be larger, and the integrated circuit chip must be proportionally larger. Consequently, the cost of the integrated circuit will increase, and the power consumption of the circuit will increase, too.

As has been described, the conventional differential current amplifier circuit needs more elements or must comprise large-sized transistors, in order to have a greater current gain. The conventional circuit inevitably consumes much power, and must be made of a large, high-cost integrated-circuit chip.

The present invention has been made to solve the problems described above. Its object is to provide a differential current amplifier circuit which is relatively simple in structure, needs no additional DC current source, and can notwithstanding obtain a great current gain, requires a relatively small number of elements, consumes but a little power, and can hence be made of a low cost integrated circuit.

DISCLOSURE OF THE INVENTION

A differential current amplifier circuit according to the present invention has first to sixth bipolar transistors of the same polarity, and first and second resistors. The first and second bipolar transistors have their emitters connected to each other. The first and second resistors are coupled between the collector-base path of the first bipolar transistor and that of the second bipolar transistor. The base and collector of the third bipolar transistor are connected together, and the collector-emitter path thereof is connected between the emitter node of the first and second bipolar transistors and a predetermined potential terminal. The base and emitter of the fourth bipolar transistor are connected to the base and emitter of the third bipolar transistor, respectively. The fifth and sixth bipolar transistors have their emitters connected to each other, the node of which is coupled to the collector of the fourth bipolar transistor. The bases of the fifth and sixth bipolar transistors are connected to the collectors of the second and first bipolar transistors, respectively. The collectors of the fifth and sixth bipolar transistors are coupled to the a second output terminal and a first output terminal, respectively. The first and second bipolar transistors have their bases connected together, and their collectors connected to a first signal input terminal and a second signal input terminal, respectively. Alternatively, the first and second bipolar transistors have their collectors connected together, and their bases connected to the first and second signal input terminals, respectively.

Assuming that the first and second resistors have the same resistance R, the base node of or collector node of the first and second transistors can be regarded as ground potential point in the case where an input signal current $(I+i)$ obtained by superposing a signal component on the DC component is input to the first signal input terminal, and an input signal current $(I-i)$ obtained by superposing a signal component $(-i)$, which is differential to the signal component $(+i)$, on the DC component is input to the second signal input terminal. The signal component i flows to the first and second resistors, and flows to neither the first transistor nor the second transistor. In other words, the DC current 2I, superposed with no signal currents and hence clean, flows to the third transistor. Hence, a DC current $2n \cdot I$ (where n is the current-mirror ratio, or the emitterarea ratio) flows to the fourth transistor coupled to the third transistor in current-mirror fashion. Since a DC current $n \cdot I$ flows to the fifth and sixth transistors, the AC emitter resistance re of these transistors is:

$re = VT/(n \cdot I)$ (VT is thermal voltage).

The signal current component $i_2$ flowing to the fifth and sixth transistors is:

$i_2 = R \cdot i/re$.

Therefore, the current gain Gi is:

$Gi = i_2 = n \cdot I \cdot R/VT$.

As has been described, a DC current, which is superposed with no signal currents and is hence clean, flows to the third and fourth transistors. Therefore, the circuit requires no DC current source for these transistors. The circuit is relatively simple in structure, requiring a small number of elements, consumes but a little power, and can be made of a low-cost integrated circuit.

BEST MODES OF CARRYING OUT THE INVENTION

An embodiment of the present invention will now be described, with reference to the accompanying drawings.

Figure 3:
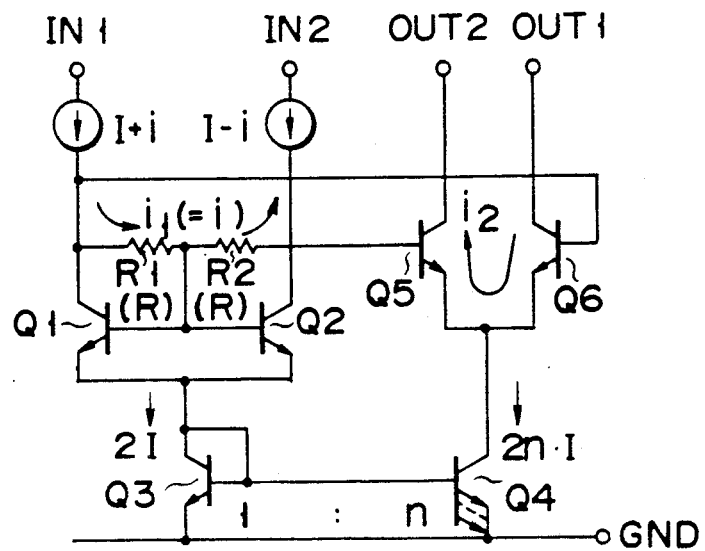
FIG. 3 is a circuit diagram illustrating a differential amplifier circuit according to an embodiment of the present invention.

FIG. 3 illustrates a differential current amplifier circuit according to a first embodiment of the present invention, which is formed in a semiconductor integrated circuit. As is shown in FIG. 3, the amplifier circuit comprises first and second NPN transistors Q1 and Q2, the emitters of which are connected to each other and the bases of which are connected to each other. A resistor R1 is connected between the collector of the transistor Q1 and the base node of the transistors Q1 and Q2. A resistor R2 is connected between the collector of the transistor Q2 and the base node of the transistors Q1 and Q2. The collectors of the transistors Q1 and Q2 are coupled to a first signal input terminal IN1 and a second signal input terminal IN2, respectively.

A third NPN transistor Q3 has its collector-emitter path connected between the emitter node of the transistors Q1 and Q2 and the low potential (i.e., the ground GND in this embodiment), and has its collector and base connected to each other (that is, diode-connected). A fourth NPN transistor Q4 has an emitter area which is n times greater than that of the transistor Q3, and is connected to the transistor Q3 in current-mirror fashion (that is, its base and emitter are connected to the base and emitter of the transistor Q3, respectively).

A fifth NPN transistors Q5 and a sixth NPN transistor Q6 have their emitters connected to each other, thus forming a differential pair. The emitter node of these transistor Q5 and Q6 is connected to the collector of the transistor Q4. Their bases are connected to the collectors of the transistors Q1 and Q2, respectively. The collector of the transistor Q6 is connected to a first output terminal OUT1, and the collector of the transistor Q5 is coupled to the second output terminal OUT2.

Let us assume that in the differential current amplifier circuit shown in FIG. 3, the transistors Q1 and Q2 have substantially identical characteristics, and that the resistors R1 and R2 have the same resistance. Then, the base node of the transistors Q1 and Q2 is regarded as a ground potential point when the first signal input terminal IN1 receives an input signal current $(I+i)$ consisting of a DC component I and a signal component $(+i)$ superposed on the DC component I, and the second input signal terminal IN2 receives an input signal current $(I-i)$ consisting of a DC component I and a signal component $(-i)$ superposed on the DC component I and differential to the signal component $(+i)$. In this case, the signal current component $i_1(=i)$ flows to the resistors R1 and R2, and flows to neither the transistor Q nor the transistor Q2. In other words, a DC current 2I, which is superposed with signal currents and is therefore clean, flows to the transistor Q3. Hence, a DC current $2n \cdot I$ flows to the transistor Q4 connected to the transistor Q3 in current-mirror fashion at the ratio of 1:n.

A DC current of n·I flows to the transistors Q5 and Q6. Hence, the AC emitter resistances re (i.e., $re_5$ and $re_6$) of the transistors Q5 and Q6 are:

$$re = re_5 = re_6 = VT/n \cdot I$$

where VT is a thermal voltage which is 26 mV at 300° K.

A signal current component $i_2$ flows to the transistors Q5 and Q6. Therefore:

$$i_1 \cdot R = re \cdot i_2.$$

Hence:

$$i_2 = R \cdot i_1/re.$$

Therefore, the current gain Gi is:

$$Gi = i_2/i_1 = n \cdot I \cdot R/VT \quad (3).$$

Figure 1:
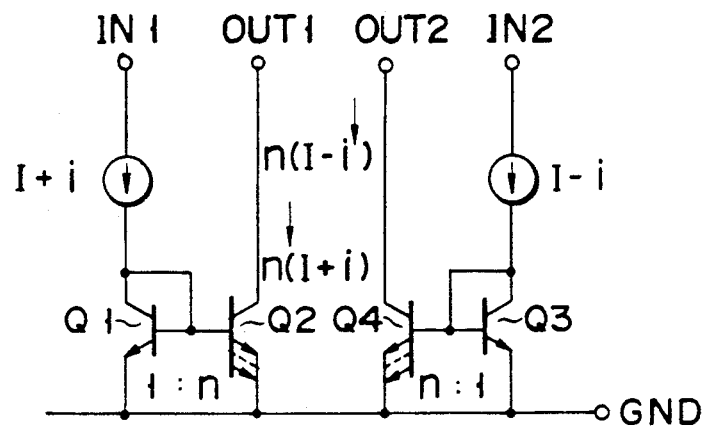
FIG. 1 is a circuit diagram showing a conventional differential current amplifier circuit.

Gi in equation (3) is I·R/VT times greater than the current gain Gi of the differential current amplifier circuit illustrated in FIG. 1, which is defined by equation (1).

Assuming that n=1, I=100 μA, R=10kΩ, then:

$$Gi = 38.5 \ (=31.7 \ dB).$$

In this case, Gi is about 38.5 times greater than the current gain Gi of the differential current amplifier circuit shown in FIG. 1.

Figure 4:
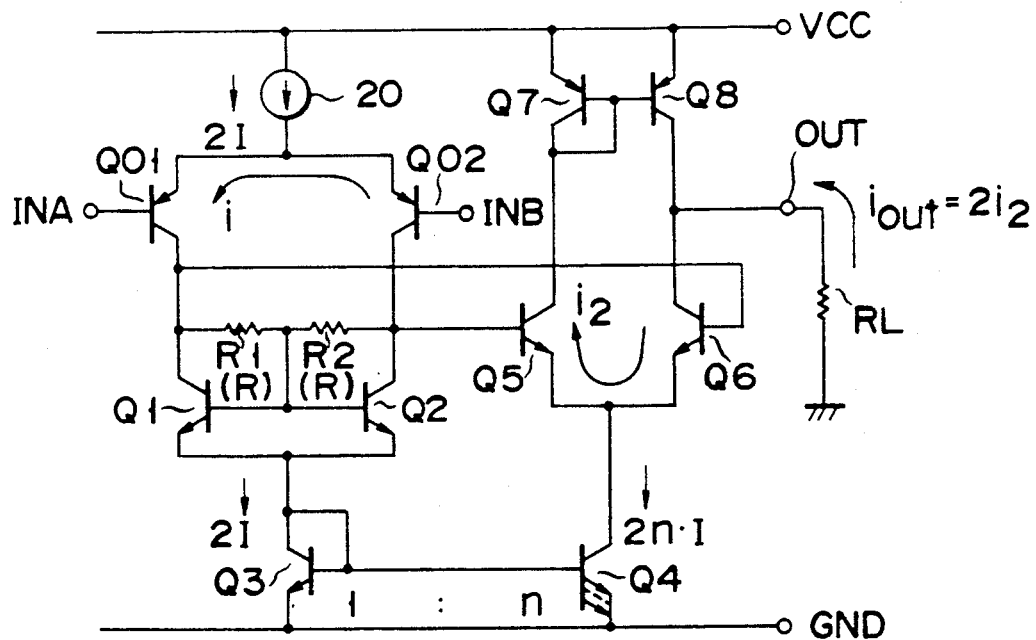
FIG. 4 is a circuit diagram showing a modification of the differential current amplifier circuit shown in FIG. 3.

FIG. 4 shows a modification of the differential current amplifier circuit illustrated in FIG. 3. This amplifier circuit is different from the circuit of FIG. 3 in two respects. First, it has an input-signal current source. Second, it has transistors Q7 and Q8. The circuit is identical to the circuit of FIG. 3 in all other respects, and the same symbols and numerals are therefore used to designate the same components as those illustrated in FIG. 3. The current source supplies a differential input-signal current consisting of a DC component I and a signal component (either +i or −i) superposed on the DC component I. The input-signal current source comprises PNP transistors Q01 and Q02 and a constant current source 20. The NPN transistors Q01 and Q02 have their emitters connected together and, thus, constitute a differential pair. The constant current source 20 is connected between the emitter node of the transistors Q01 and Q02 and a high power-supply potential (i.e., the Vcc-power potential in this embodiment), and supplies a constant current 2I. The collectors of the transistors Q01 and Q02 are connected to the collectors of the transistors Q1 and Q2, respectively. Hence, when input voltages INA and INB, either containing a differential signal component, are applied to the bases of the transistors Q01 and Q02, signal currents (I+i) and (I−i) flow to the transistors Q1 and Q2, respectively. The PNP transistors Q7 and Q8 are connected together in mirror-current fashion. Their emitters are coupled to the Vcc potential, their bases are connected to each other, and their collectors are connected to the collectors of the transistors Q5 and Q6. The base and collector of the transistor Q7 are connected together. The collector of the transistor Q8 is coupled to an output terminal OUT. A load resistor RL is connected between the output terminal OUT and the ground GND.

The differential current amplifier circuit of FIG. 4 operates, basically in the same way as the circuit of FIG. 3. However, the current $n(I-i_2)$ of the transistor Q5 is subtracted from the current $n(I+i_2)$ of the transistor Q6 by means of the transistors Q7 and Q8, thereby extracting a signal component. The current $i_{out}$ output by the amplifier circuit is $2i_2$. Therefore, the current gain Gi of the circuit is:

$$\begin{aligned} Gi &= i_{out}/i \\ &= 2n \cdot i \cdot R/VT \end{aligned} \quad (4)$$

Figure 2:
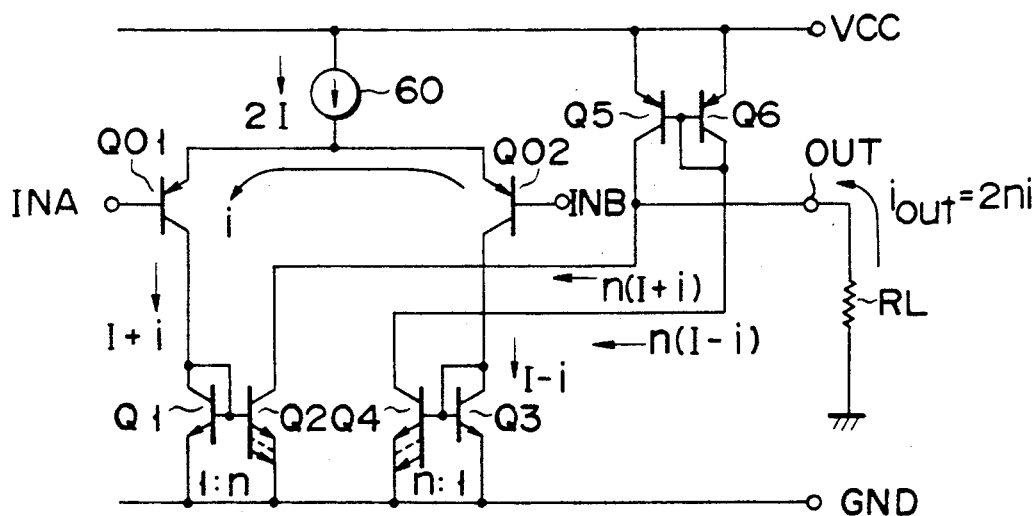
FIG. 2 is a circuit diagram showing another conventional differential current amplifier circuit.

Gi in equation (4) is i·R/VT times greater than the current gain Gi of the differential current amplifier circuit illustrated in FIG. 2, which is defined by equation (2).

Assuming that n=1, I=100 μA, R=10kΩ, Gi of the conventional circuit of FIG. 2, which is defined by equation (2), is:

$$Gi = 2 \ (6 \ dB).$$

By contrast, Gi of the present embodiment (FIG. 4) is:

$$\begin{aligned} Gi &= 2 \times 100 \ \mu A \times 10k\Omega/26 \ mV \\ &= 76.9 \ (=37.7 \ dB) \end{aligned}$$

In this case, Gi is about 38.5 times greater than the current gain Gi of the differential current amplifier circuit shown in FIG. 2

If the current-mirror ratio n is set at 38.5 in order to obtain a greater current gain Gi in the differential current amplifier circuit of FIG. 2, the circuit will require transistors of greater size, and will inevitably made of an integrated circuit chip which has a greater size and, hence, a higher cost, and consumes more power.

Figure 5:
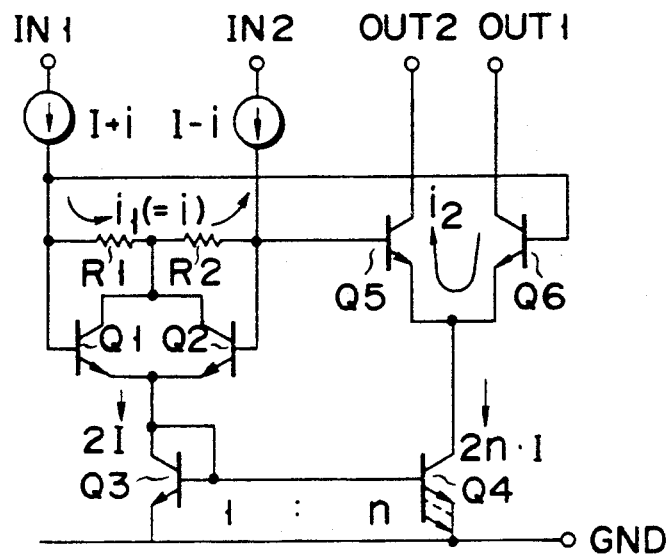
FIG. 5 is a circuit diagram showing a differential current amplifier circuit according to another embodiment of the invention.

FIG. 5 illustrates a differential current amplifier circuit according to a second embodiment of the present invention. This amplifier circuit is different from the circuit of FIG. 3 in three respects only. First, the emitters of the first and second NPN transistors Q1 and Q2 are connected to each other, the collectors thereof are coupled to each other, and the bases thereof are connected to the first and second signal input terminals IN1 and IN2, respectively. Second, the first resistor R1 is coupled between the base of the first NPN transistor Q1 and the collector node of the NPN transistors Q1 and Q2. Third, the second resistor R2 is connected between the base of the second NPN transistor Q2 and the collector node of the NPN transistors Q1 and Q2. In any other respect, the circuit of FIG. 5 is identical to that one shown in FIG. 3, and the same symbols and numerals are therefore used to designate the same components as those illustrated in FIG. 3.

The differential current amplifier circuit of FIG. 5 operates, basically in the same way as the circuit of FIG. 3. Therefore, its current gain Gi is:

$$Gi = i_2/i_1 = n \cdot I \cdot R/VT \quad (5).$$

Obviously, equation (5) is exactly the same as equation (3). It follows that the current gain Gi of the amplifier circuit of FIG. 5 is equal to that of the amplifier circuit illustrated in FIG. 3.

Figure 6:
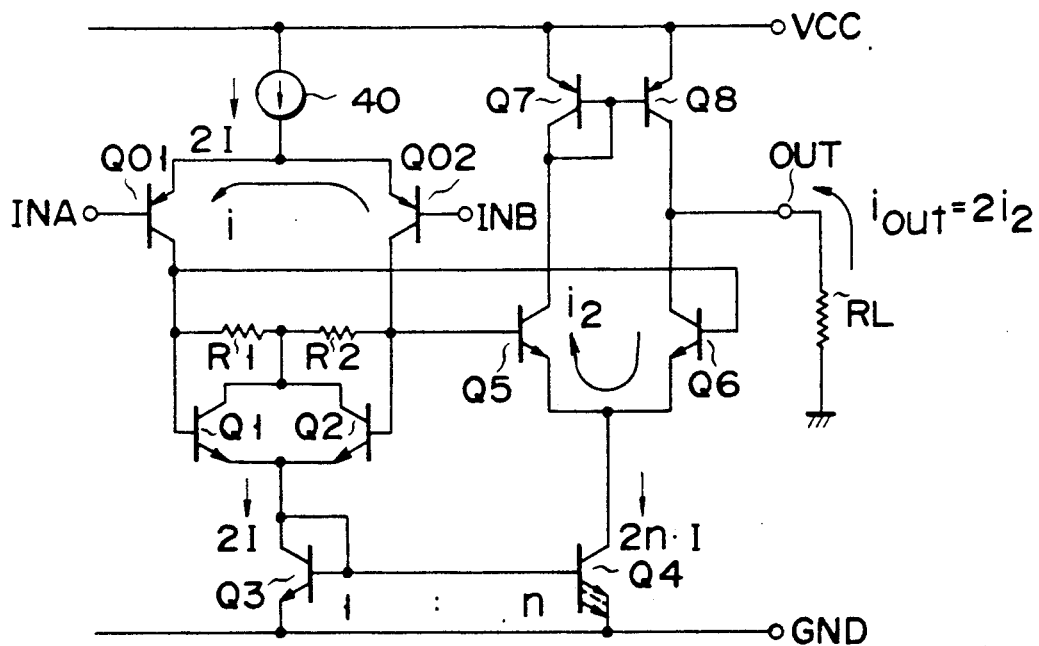
FIG. 6 is a circuit diagram illustrating a modification of the differential current amplifier circuit shown in FIG. 5.

FIG. 6 illustrates a modification of the differential current amplifier circuit shown in FIG. 5. This circuit is identical to the circuit of FIG. 5, except for two respects. First, it has an input-signal current source. Second, it has NPN transistors Q7 and Q8. The circuit is identical to the circuit of FIG. 5 in all other respects, and the same symbols and numerals are therefore used to designate the same components as those illustrated in FIG. 5. The current source supplies a differential input-signal current consisting of a DC component I and a signal component (either $+i$ or $-i$) superposed on the DC component I.

The input-signal current source comprises PNP transistors Q01 and Q02 and a constant current source 40. The NPN transistors Q7 and Q8 are arranged in the same way as in the circuit shown in FIG. 4. The collector of the transistor Q8 is connected to an output terminal OUT. A load resistor RL is connected between the output terminal OUT and the ground GND.

The differential current amplifier circuit of FIG. 6 operates in the same way as the circuit of FIG. 4. The current $n(I-i_2)$ of the transistor Q5 is subtracted from the current $n(I+i_2)$ of the transistor Q6 by means of the transistors Q7 and Q8, thereby extracting a signal component. The current $i_{out}$ output by the amplifier circuit is $2i_2$. Therefore, the current gain Gi of the circuit is:

$$Gi = i_{out}/i \qquad (4)$$
$$= 2n \cdot I \cdot R/VT$$

Obviously, equation (6) is exactly the same as equation (4). Hence, the current gain Gi of the amplifier circuit of FIG. 6 is equal to that of the amplifier circuit illustrated in FIG. 4.

In the embodiments and the modifications thereof, all described above, the Vcc power-supply potential can be replaced by the ground potential, and the ground potential can be replaced by a negative power potential. Further, the high power-supply potential and the low power-supply potential can be replaced by each other, and the PNP transistors can be replaced by the NPN transistors, and vice versa.

As has been described above, the differential current amplifier circuit according to the present invention is relatively simple in structure, requires no additional DC current source, and can notwithstanding obtain a great current gain, requires a relatively small number of elements, consumes but a little power, and can hence be made of a low-cost integrated circuit.

INDUSTRIAL APPLICABILITY

The differential current amplifier circuit according to the invention is useful in the case where an amplifier circuit is required which comprises a reactively small number of elements, consumes but a little power, and can notwithstanding can obtain a great current gain.

We claim:

1. A differential current amplifier circuit comprising first to sixth bipolar transistors of the same polarity, first and second resistors, characterized in that:

said first and second bipolar transistors have their emitters connected to each other;

said first and second resistors are coupled between the collector-base path of said first bipolar transistor and that of said second bipolar transistor the base and collector of said third bipolar transistor are connected together, and the collector-emitter path thereof is connected between the emitter node of the first and second bipolar transistors and a predetermined potential terminal;

the base and emitter of said fourth bipolar transistor are connected to the base and emitter of said third bipolar transistor, respectively;

said fifth and sixth bipolar transistors have their emitters connected to each other, the node of which is coupled to the collector of the fourth bipolar transistor;

the bases of said fifth and sixth bipolar transistors are connected to the the collectors of said second and first bipolar transistors, respectively;

the collectors of said fifth and sixth bipolar transistors are coupled to the a second output terminal and a first output terminal, respectively; and said first and second bipolar transistors have their bases connected together, and their collectors connected to a first signal input terminal and a second signal input terminal, respectively, or have their collectors connected together, and their bases connected to the first and second signal input terminals, respectively.

2. The differential current amplifier circuit according to claim 1, characterized in that said first to sixth bipolar transistors are NPN transistors, said first and second bipolar transistors have substantially the same characteristic, said first and second resistors have substantially the same resistance, and said predetermined potential terminal is a ground-potential terminal.

* * * * *

UNITED STATES PATENT AND TRADEMARK OFFICE
CERTIFICATE OF CORRECTION

PATENT NO. : 5,132,640
DATED : July 21, 1992
INVENTOR(S) : Tatsuo Tanaka et al.

It is certified that error appears in the above-identified patent and that said Letters Patent is hereby corrected as shown below:

Claim 1, column 8, line 18, change "transistor" to --transistor;--.

Claim 1, column 8, line 32, change "the the" to --the--.

Claim 1, column 8, line 35, after "to" delete "the".

Signed and Sealed this

Twenty-third Day of November, 1993

*Attest:*

BRUCE LEHMAN

*Attesting Officer*     *Commissioner of Patents and Trademarks*